US012734631B2

(12) United States Patent
Mizomoto et al.

(10) Patent No.: US 12,734,631 B2
(45) Date of Patent: Sep. 15, 2026

(54) PROCESSING APPARATUS, AND INSTALLING METHOD OF PROCESSING TOOL OF PROCESSING APPARATUS

(71) Applicant: Tokyo Electron Limited, Tokyo (JP)

(72) Inventors: Yasutaka Mizomoto, Kikuchi-gun (JP); Susumu Hayakawa, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 947 days.

(21) Appl. No.: 17/997,557

(22) PCT Filed: Apr. 7, 2021

(86) PCT No.: PCT/JP2021/014826
§ 371 (c)(1),
(2) Date: Oct. 31, 2022

(87) PCT Pub. No.: WO2021/220752
PCT Pub. Date: Nov. 4, 2021

(65) Prior Publication Data

US 2023/0182253 A1 Jun. 15, 2023

(30) Foreign Application Priority Data

May 1, 2020 (JP) ................................ 2020-081378

(51) Int. Cl.
*B23Q 3/157* (2006.01)
*B23Q 3/155* (2006.01)
(Continued)

(52) U.S. Cl.
CPC ...... *B23Q 11/0891* (2013.01); *B23Q 3/15503* (2016.11); *B23Q 17/0995* (2013.01);
(Continued)

(58) Field of Classification Search
CPC ............ Y10T 483/115; Y10T 483/174; B23Q 3/155–3/15793; B23Q 11/08–11/0891; B23Q 17/0995; B24B 55/04; B28D 5/22
(Continued)

(56) References Cited

U.S. PATENT DOCUMENTS 6,665,580 B1 * 12/2003 Susnjara ............ B23Q 17/0995 483/10
6,722,956 B2 * 4/2004 Okuyama ............. B24B 41/047 483/31
(Continued)

FOREIGN PATENT DOCUMENTS

JP H10-043989 A 2/1998
JP H10-340872 A 12/1998
(Continued)

OTHER PUBLICATIONS

International Search Report of PCT/JP2021/014826 dated Jun. 22, 2021.

*Primary Examiner* — Erica E Cadugan
(74) *Attorney, Agent, or Firm* — Shih IP Law Group, PLLC.

(57) ABSTRACT

A processing apparatus includes a holder configured to hold a processing target object; a processing mechanism to which a processing tool configured to process the processing target object held by the holder is installed in a replaceable manner; and an exterior cover accommodating the holder and the processing mechanism therein. The exterior cover includes an entrance opening through which a replacing apparatus configured to replace the processing tool passes when advancing to an inside of the exterior cover from an outside thereof. The processing apparatus further includes a shutter configured to open or close the entrance opening of the exterior cover.

3 Claims, 15 Drawing Sheets

(51) Int. Cl.

| | |
|---|---|
| ***B23Q 11/08*** | (2006.01) |
| ***B23Q 17/09*** | (2006.01) |
| ***B24B 45/00*** | (2006.01) |
| ***B24B 55/04*** | (2006.01) |
| ***B24B 55/06*** | (2006.01) |
| ***B28D 5/02*** | (2006.01) |
| ***H10P 52/00*** | (2026.01) |

(52) U.S. Cl.

CPC .............. *B24B 45/00* (2013.01); *B24B 55/04* (2013.01); *B24B 55/06* (2013.01); *B28D 5/022* (2013.01); *H10P 52/00* (2026.01); *B23Q 2003/15537* (2016.11); *Y10T 483/10* (2015.01); *Y10T 483/115* (2015.01); *Y10T 483/12* (2015.01); *Y10T 483/165* (2015.01); *Y10T 483/174* (2015.01)

(58) Field of Classification Search

USPC ................................ 483/3, 33; 451/451–457

See application file for complete search history.

(56) References Cited

U.S. PATENT DOCUMENTS

2007/0004572 A1* 1/2007 Arai ....................... B23Q 3/157 483/36
2007/0251922 A1 11/2007 Swedek
2014/0286734 A1* 9/2014 Oda .................. B23Q 11/0891 483/16
2015/0266153 A1* 9/2015 Kanehira ............... B23Q 11/08 483/10
2018/0178301 A1* 6/2018 Toyama ................. B23Q 11/08
2019/0283195 A1* 9/2019 Terada ............... B23Q 3/15713

FOREIGN PATENT DOCUMENTS

JP H11-274271 A 10/1999
JP 2000-052185 A 2/2000
JP 2000-343310 A 12/2000
JP 2008-246602 A 10/2008
JP 2009-050976 A 3/2009
JP 2012-168742 A 9/2012
JP 2014-205231 A 10/2014
JP 2015-093367 A 5/2015
JP 2017098540 A 6/2017
JP 6270297 B1 1/2018
JP 2018192572 A 12/2018
JP 2019-177444 A 10/2019
JP 2019-209448 A 12/2019

* cited by examiner

PROCESSING APPARATUS, AND INSTALLING METHOD OF PROCESSING TOOL OF PROCESSING APPARATUS

CROSS-REFERENCE TO RELATED APPLICATIONS

This Application is a U.S. national phase application under 35 U.S.C. § 371 of PCT Application No. PCT/JP2021/014826 filed on Apr. 7, 2021, which claims the benefit of Japanese Patent Application No. 2020-081378 filed on May 1, 2020, the entire disclosures of which are incorporated herein by reference.

TECHNICAL FIELD

The various aspects and embodiments described herein pertain generally to a processing apparatus and an installing method of a processing tool of the processing apparatus.

BACKGROUND

A grinding device described in Patent Document 1 includes a spindle, a wheel mount disposed at a lower end of the spindle, and a grinding wheel detachably mounted to a bottom surface of the wheel mount. The grinding wheel includes an annular wheel base and a plurality of grinding whetstones annularly arranged on a bottom surface of the wheel base. An operator mounts the wheel base to the bottom surface of the wheel mount by a fastening bolt.

PRIOR ART DOCUMENT

Patent Document 1: Japanese Publication No. 2019-177444

DISCLOSURE OF THE INVENTION

Means for Solving the Problems

In one exemplary embodiment, a processing apparatus includes a holder configured to hold a processing target object; a processing mechanism to which a processing tool configured to process the processing target object held by the holder is installed in a replaceable manner; and an exterior cover accommodating the holder and the processing mechanism therein. The exterior cover includes an entrance opening through which a replacing apparatus configured to replace the processing tool passes when advancing to an inside of the exterior cover from an outside thereof. The processing apparatus further includes a shutter configured to open or close the entrance opening of the exterior cover.

DETAILED DESCRIPTION

Figure 1:
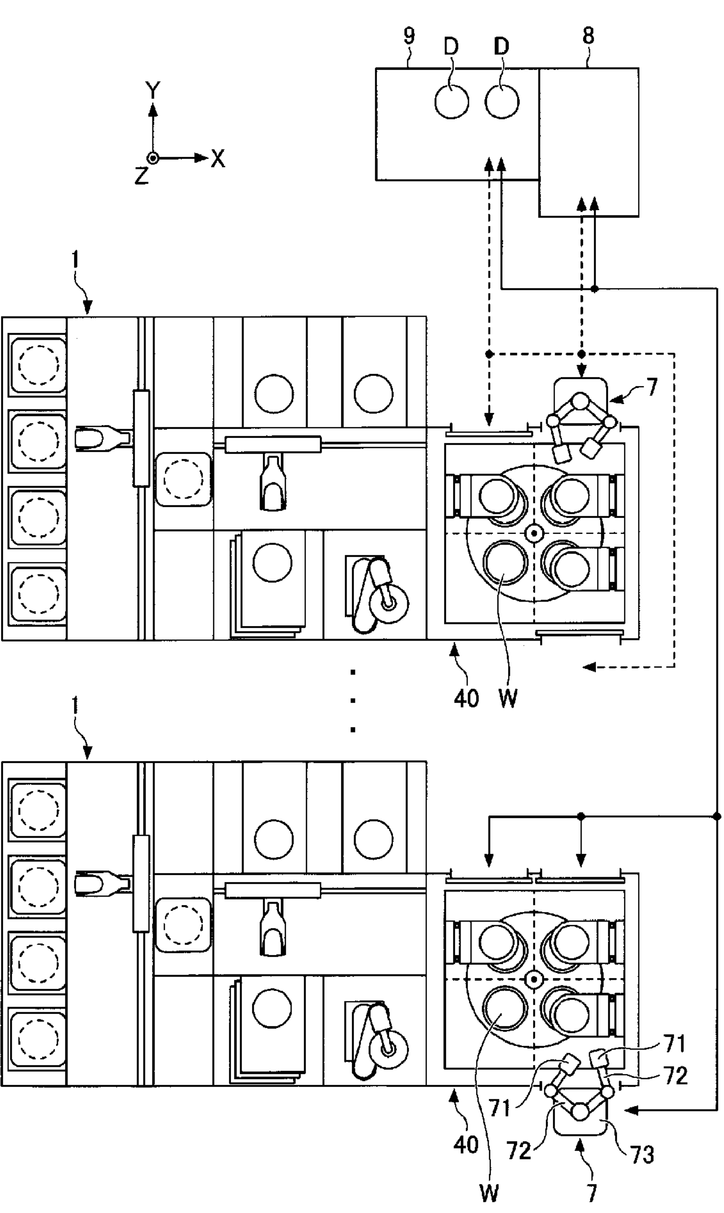
FIG. 1 is a plan view illustrating an example of a layout of a factory.

Hereinafter, an exemplary embodiment of the present disclosure will be described with reference to the accompanying drawings. In the various drawings, same or corresponding parts will be assigned same reference numerals, and redundant description may be omitted. In the present specification, the X-axis direction, the Y-axis direction, and the Z-axis direction are orthogonal to each other. The X-axis and Y-axis directions are horizontal directions, and the Z-axis direction is a vertical direction.

As shown in FIG. 1, a grinding system 1 configured to grind a substrate W, a replacing apparatus 7 configured to replace a grinding tool D mounted in the grinding system 1, a storage 8 for storing therein the replacing apparatus 7, and a storage 9 for storing therein the grinding tool D are installed in a room of a factory, for example. The factory may be, for example, a semiconductor factory, and the room may be, for example, a clean room.

The substrate W includes a semiconductor substrate such as a silicon wafer or a compound semiconductor wafer, or a glass substrate. The substrate W may further include a device layer formed on a surface of the semiconductor substrate or the glass substrate. The device layer includes an electronic circuit. Further, the substrate W may be a combined substrate composed of a plurality of substrates bonded to each other.

As shown in FIG. 1, a plurality of grinding systems 1 may be disposed in the factory room, or only one may be disposed therein. The grinding system 1 is configured to grind the substrate W with the grinding tool D. If the grinding tool D is worn out, it is replaced by the replacing apparatus 7. Since the replacing apparatus 7, instead of a person, replaces the grinding tool D, it is possible to suppress the person from getting dirty. Replacing the grinding tool D includes separating a used grinding tool D and installing an unused grinding tool D.

The storage 9 stores therein the grinding tools D. The used grinding tool D and the unused grinding tool D are stored in the same storage 9 in the present exemplary embodiment. However, they may be stored in different storages 9. The storage 9 is provided outside the grinding system 1. Therefore, the grinding system 1 can be scaled down. Since the storage 9 is provided outside the grinding system 1, a self-propelled robot is used as the replacing apparatus 7, unlike a case where the storage 9 is provided inside the grinding system 1.

The replacing apparatus 7 stands by in the storage 8 until it receives a replacement instruction for the grinding tool D. If the replacement instruction is received, the replacing apparatus 7 travels to the grinding system 1, for example, and separates the used grinding tool D from the grinding system 1. Then, the replacing apparatus 7 travels to the storage 9 while holding the separated used grinding tool D, and places the used grinding tool D in the storage 9. Thereafter, the replacing apparatus 7 acquires the unused grinding tool D from the storage 9, travels to the grinding system 1 while holding the acquired unused grinding tool D, and installs the unused grinding tool D to the grinding system 1. Finally, the replacing apparatus 7 returns to the storage 8 and stands by.

Alternatively, if the replacing apparatus 7 receives the replacement instruction, it first travels to the storage 9, acquires the unused grinding tool D from the storage 9, and travels to the grinding system 1 while holding the acquired unused grinding tool D. Then, the replacing apparatus 7 separates the used grinding tool D from the grinding system 1. Next, the replacing apparatus 7 installs the unused grinding tool D to the grinding system 1. Thereafter, the replacing apparatus 7 travels to the storage 9 while holding the separated used grinding tool D, and places the used grinding tool D in the storage 9. Finally, the replacing apparatus 7 returns to the storage 8 and stands by.

The storage 9 is shared by the plurality of grinding systems 1. As compared to a case where the storage 9 is provided for each of the grinding systems 1 individually, the number of the storage 9 that needs to be installed can be reduced.

Figure 2:
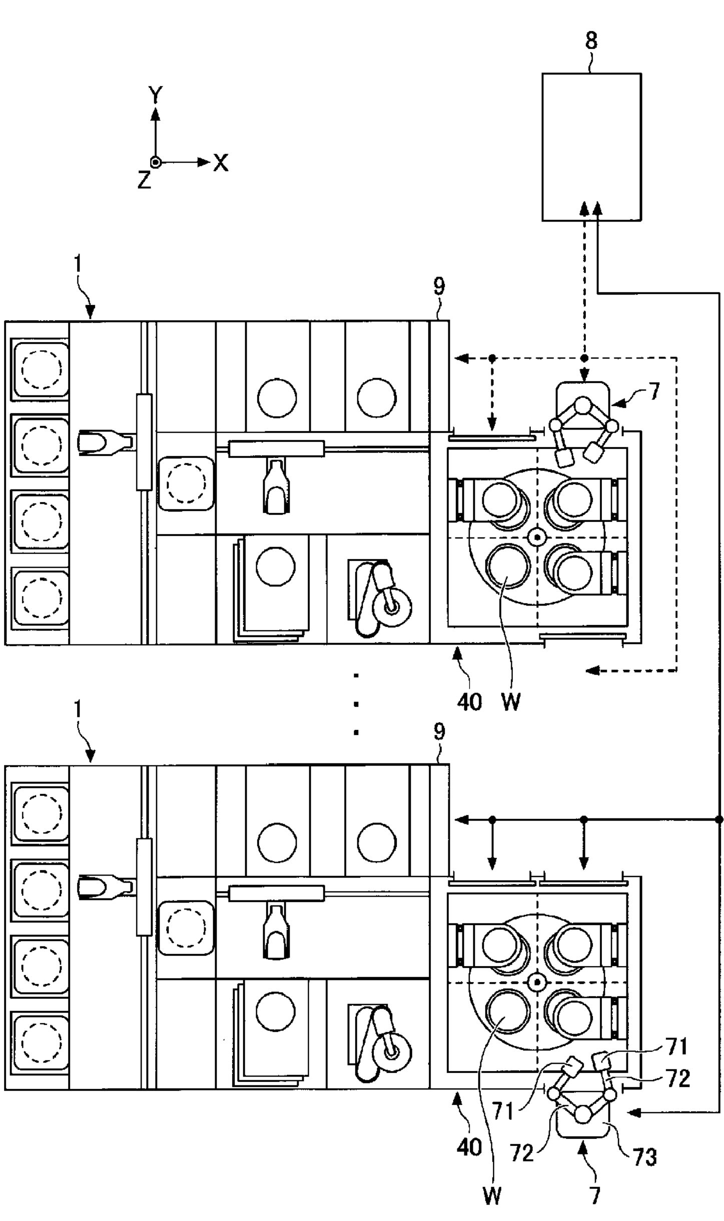
FIG. 2 is a plan view illustrating another example of the layout of the factory.

In addition, as illustrated in FIG. 2, the storage 9 may be provided for each of the grinding systems 1 individually. In this case, as compared to the case where the storage 9 is shared by the plurality of grinding systems 1, each storage 9 can be disposed closer to the corresponding grinding system 1.

Figure 11:
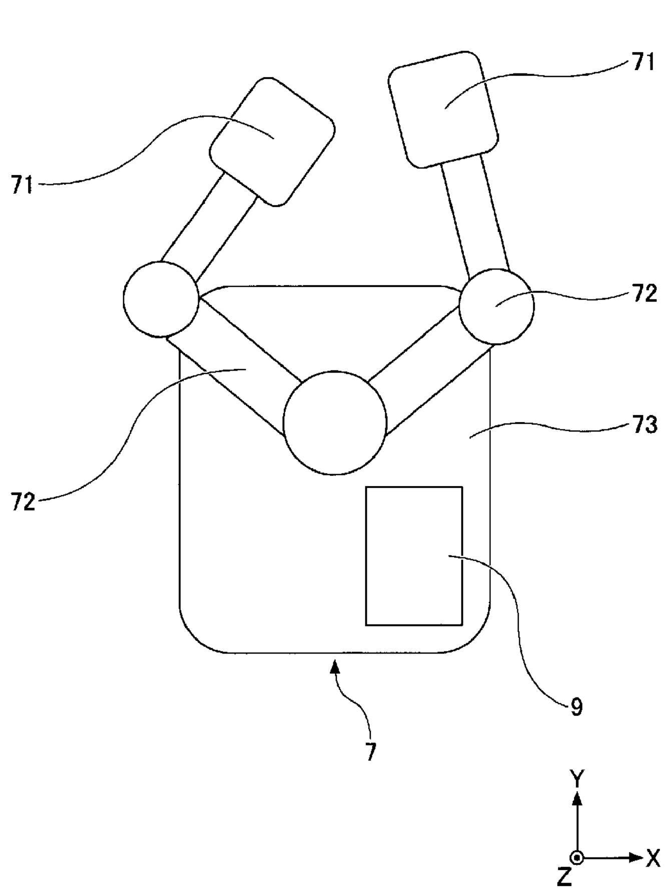
FIG. 11 is a plan view illustrating an example of a replacing apparatus equipped with a storage.

In addition, although the storage 9 shown in FIG. 1 and FIG. 2 is provided separately from the replacing apparatus 7, the replacing apparatus 7 itself may be equipped with the storage 9, as shown in FIG. 11. The storage 9 of the replacing apparatus 7 is moved along with a traveling table 73 of the replacing apparatus 7. In this case, a travel distance of the replacing apparatus 7 can be shortened. The storage 9 of the replacing apparatus 7 temporarily stores therein the grinding tool D that is transferred between the storage 9 (see FIG. 1 or FIG. 2) fixed at the outside of the replacing apparatus 7 and a processing mechanism 43 of the grinding system 1.

Now, referring to FIG. 3, the grinding system 1 will be described. The grinding system 1 includes a carry-in/out section 2, a cleaning section 3, a grinding section 4, and a controller 5. The carry-in/out section 2, the cleaning section 3 and the grinding section 4 are arranged in this order from the negative X-axis side to the positive X-axis side.

The carry-in/out section 2 has a placing table 21. The placing table 21 is a place where a cassette C is placed. The cassette C accommodates therein a plurality of substrates W at a regular interval therebetween in a vertical direction. The placing table 21 includes a plurality of placement plates 22 arranged in a row in the Y-axis direction. The cassette C is disposed on each of the plurality of placement plates 22. Here, the number of the placement plates 22 is not particularly limited. Likewise, the number of the cassettes C is not particularly limited, either.

Further, the carry-in/out section 2 has a first transfer region 23. When viewed from the top, the first transfer region 23 is provided next to a transition device 35 to be described later and the placing table 21 so as to be interposed between the placing table 21 and the transition device 35. The carry-in/out section 2 has a first transfer device 24 configured to transfer the substrate W in the first transfer region 23. The first transfer device 24 transfers the substrate W between a multiplicity of apparatuses disposed next to the first transfer region 23. The first transfer device 24 includes a first transfer arm 24*a* configured to hold the substrate W. The first transfer arm 24*a* is movable in horizontal directions (both in the X-axis direction and the Y-axis direction) and in a vertical direction, and pivotable around a vertical axis. The number of the first transfer arm 24*a* may be one or more.

The cleaning section 3 has a first cleaning apparatus 31. The first cleaning apparatus 31 scrub-cleans the substrate W after being ground by a grinding apparatus 40 to be described later. The first cleaning apparatus 31 includes a cleaning body such as a sponge or a brush, and removes particles such as grinding debris with the cleaning body.

In addition, the cleaning section 3 has a second cleaning apparatus 32. The second cleaning apparatus 32 etches the substrate W after being ground by the grinding apparatus 40 with a chemical liquid. The second cleaning apparatus 32 includes a spin chuck configured to hold the substrate W; and a nozzle configured to discharge the chemical liquid. The nozzle supplies the chemical liquid to the center of a top surface of the substrate W being rotated.

The cleaning section 3 may also have a third cleaning apparatus 33. Unlike the first cleaning apparatus 31 and the second cleaning apparatus 32, the third cleaning apparatus 33 cleans the substrate W before being ground by the grinding apparatus 40. The third cleaning apparatus 33 scrub-cleans the substrate W, the same as the first cleaning apparatus 31. Thus, a foreign substance can be suppressed from being mixed in between a chuck 42 of the grinding apparatus 40 and the substrate W, so that the substrate W can be ground flat.

The cleaning section 3 is equipped with a detecting apparatus 34. The detecting apparatus 34 detects the center of the substrate W before being ground by the grinding apparatus 40. When viewed from the top, the center of the chuck 42 of the grinding apparatus 40 and the center of the substrate W may be aligned. The detecting apparatus 34 may detect the crystal orientation of the substrate W in addition to the center of the substrate W. Specifically, it may detect a notch or an orientation flat indicating the crystal orientation of the substrate W. On a rotational coordinate system that is rotated along with the chuck 42, the crystal orientation of the substrate W can be aligned to a required direction.

The first cleaning apparatus 31, the third cleaning apparatus 33, and the detecting apparatus 34 may be vertically stacked in order to reduce the installation area of the grinding system 1. For example, the detecting apparatus 34, the first cleaning apparatus 31, and the third cleaning apparatus 33 are arranged in this order from bottom to top. Here, however, the order is not specifically limited.

The cleaning section 3 has the transition device 35. The transition device 35 temporarily accommodates the substrate W therein. A plurality of transition devices 35 may be stacked vertically. The layout and the number of the transition devices 35 are not particularly limited.

The cleaning section 3 has a second transfer region 36. When viewed from the top, the second transfer region 36 is disposed next to the first cleaning apparatus 31, the second cleaning apparatus 32 and the transition device 35 so that three sides of the second transfer region 36 are surrounded by the first cleaning apparatus 31, the second cleaning apparatus 32, and the transition device 35. The cleaning section 3 is equipped with a second transfer device 37 configured to transfer the substrate W in the second transfer region 36. The second transfer device 37 transfers the substrate W between the multiplicity of apparatuses located next to the second transfer region 36. The second transfer device 37 includes a second transfer arm 37*a* configured to hold the substrate W. The second transfer arm 37*a* is movable in horizontal directions (both the X-axis direction and the Y-axis direction) and a vertical direction, and pivotable around a vertical axis. The number of the second transfer arm 37*a* may be one or more.

The cleaning section 3 has a shape in which a corner of a rectangle is cut out, when viewed from the top, and a third transfer region 38 is provided in this cut-out portion. When viewed from the top, the third transfer region 38 is disposed next to the second transfer region 36, the first cleaning apparatus 31 and the grinding apparatus 40 so that three sides of the third transfer region 38 are surrounded by the second transfer region 36, the first cleaning apparatus 31, and the grinding apparatus 40. The third transfer region 38 may be provided inside a housing that encloses both the cleaning section 3 and the third transfer region 38, or may be provided inside a housing different from the housing enclosing the cleaning section 3 and be connected to the cleaning section 3.

The grinding system 1 is equipped with a third transfer device 39 configured to transfer the substrate W in the third transfer region 38. The third transfer device 39 transfers the substrate W between the plurality of apparatuses disposed next to the third transfer region 38. The third transfer device 39 has an attraction pad 39*a* configured to hold the substrate W. The attraction pad 39*a* attracts the substrate W from above. The attraction pad 39*a* is movable in horizontal directions (both the X-axis direction and the Y-axis direction) and a vertical direction, and pivotable around a vertical axis.

The grinding section 4 includes the grinding apparatus 40. The grinding apparatus 40 is configured to grind the substrate W. The grinding includes polishing. Either fixed abrasive grains or free abrasive grains may be used as abrasive grains for use in the grinding. The grinding apparatus 40 includes, by way of example, a table 41, four chucks 42, and three processing mechanisms 43.

The table 41 holds the four chucks 42 around a rotation center line R1 at a regular distance therebetween, and is rotated about the rotation center line R1. Each of the four chucks 42 is rotated together with the table 41 and moved to a carry-in/out position A0, a first grinding position A1, a second grinding position A2, a third grinding position A3, and back to the carry-in/out position A0.

The carry-in/out position A0 serves as a carry-in position where a carry-in of the substrate W is performed and a carry-out position where a carry-out of the substrate W is performed. Although the carry-in position and the carry-out position are identical in the present exemplary embodiment, they may be different. The first grinding position A1 is a position where first grinding of the substrate W is performed. The second grinding position A2 is a position where second grinding of the substrate W is performed. The third grinding position A3 is a position where third grinding of the substrate W is performed.

Figure 4:
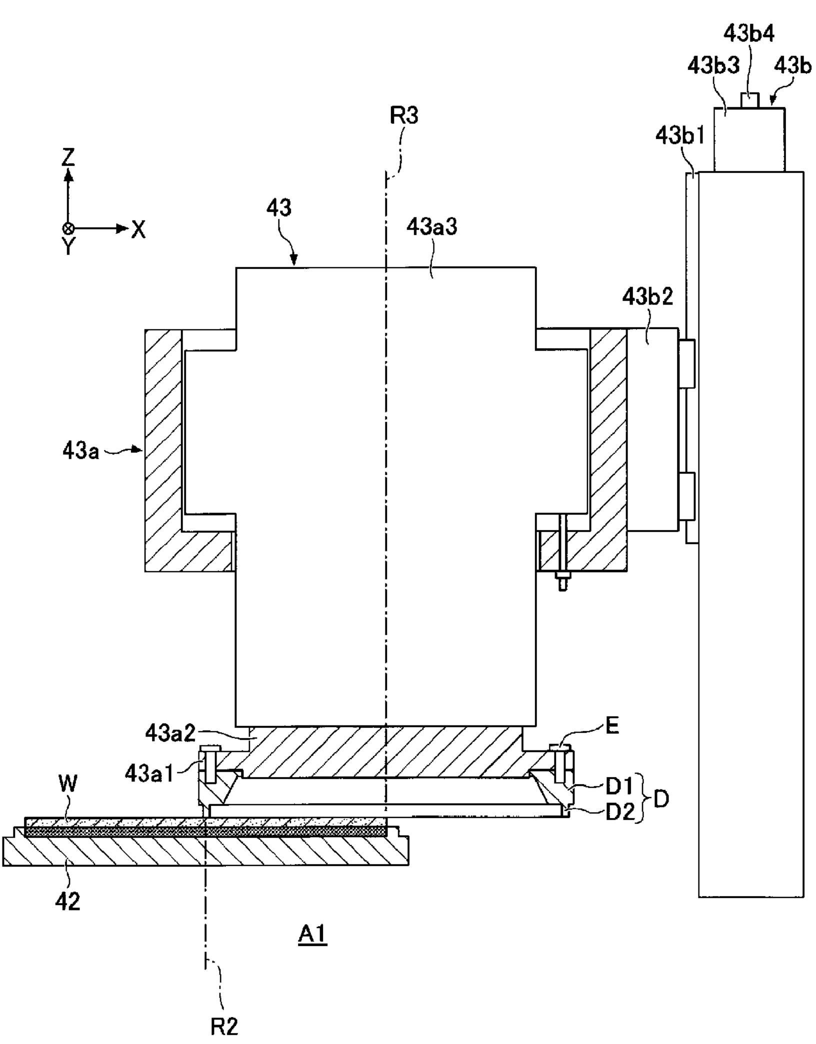
FIG. 4 is a cross sectional view illustrating a processing mechanism of a grinding apparatus according to an exemplary embodiment.

The four chucks 42 are mounted to the table 41 so as to be rotatable about their own rotation center lines R2 (see FIG. 4). At the first grinding position A1, the second grinding position A2 and the third grinding position A3, the chucks 42 are rotated about their own rotation center lines R2.

One of the processing mechanisms 43 performs the first grinding of the substrate W at the first grinding position A1. Another processing mechanism 43 performs the second grinding of the substrate W at the second grinding position A2. The other processing mechanism 43 performs the third grinding of the substrate W at the third grinding position A3.

In addition, the number of the processing mechanisms 43 may be one or more. Further, the number of the chucks 42 needs to be larger than the number of the processing mechanisms 43. Here, however, the table 41 is optional. When there is no table 41, the number of the chucks 42 may be equal to the number of the processing mechanisms 43, or may be only one.

The controller 5 is, for example, a computer, and includes a CPU (Central Processing Unit) 51 and a recording medium 52 such as a memory. The recording medium 52 stores therein a program for controlling various processings performed in the grinding system 1. The controller 5 controls an operation of the grinding system 1 by causing the CPU 51 to execute the program stored in the recording medium 52.

Now, the operation of the grinding system 1 will be explained. The following operations are performed under the control of the controller 5.

First, the first transfer device 24 takes out the substrate W from the cassette C, and transfers it to the transition device 35. Then, the second transfer device 37 transfers the substrate W from the transition device 35 to the third cleaning apparatus 33.

Then, the third cleaning apparatus 33 cleans substrate W before being ground by the grinding apparatus 40. Since the clean substrate W can be placed on the chuck 42 of the grinding apparatus 40, particles can be suppressed from being mixed in. Therefore, the substrate W can be ground flat, so that deterioration of thickness discrepancy of the substrate W can be suppressed. After the substrate W is dried, the second transfer device 37 transfers the substrate W from the third cleaning apparatus 33 to the detecting apparatus 34.

Here, if the substrate W before being ground is clean, or if the grinding apparatus 40 has a device for cleaning the substrate W before being ground, the third cleaning apparatus 33 may be omitted. In such a case, the second transfer device 37 transfers the substrate W from the transition device 35 to the detecting apparatus 34.

Subsequently, the detecting apparatus 34 detects the center of the substrate W. The detecting apparatus 34 may also detect the crystal orientation of the substrate W, specifically, a notch or the like. Thereafter, the third transfer device 39 transfers the substrate W from the detecting apparatus 34 to the chuck 42 of the grinding apparatus 40. In the meantime, the controller 5 controls the third transfer device 49 based on a detection result of the detecting apparatus 34, and aligns the center of the chuck 42 with the center of the substrate W. Further, the controller 5 controls the third transfer device 39 based on the detection result of the detecting apparatus 34, and aligns the crystal orientation of the substrate W to a required direction on the rotational coordinate system that is rotated along with the chuck 42.

Thereafter, the grinding apparatus 40 grinds the top surface of the substrate W. The substrate W is rotated along with the table 41 and moved to the carry-in/out position A0, the first grinding position A1, the second grinding position A2, the third grinding position A3, and back to the carry-in/out position A0 in this order. In the meantime, the first grinding, the second grinding, and the third grinding are performed. Thereafter, the third transfer device 39 transfers the substrate W from the chuck 42 to the first cleaning apparatus 31.

Then, the first cleaning apparatus 31 cleans the top surface of the substrate W to remove particles such as grinding debris. After the substrate W is dried, the second transfer device 37 transfers the substrate W from the first cleaning apparatus 31 to the second cleaning apparatus 32.

Subsequently, the second cleaning apparatus 32 etches the top surface of the substrate W to remove a grinding mark. After the substrate W is dried, the second transfer device 37 transfers the substrate W from the second cleaning apparatus 32 to the transition device 35. Then, the first transfer device 24 transfers the substrate W from the transition device 35 to the cassette C. The substrate W is accommodated in the cassette C.

Now, with reference to FIG. 4, the processing mechanism 43 of the grinding apparatus 40 will be explained. The processing mechanism 43 has a movable unit 43*a* to which the grinding tool D is mounted. The processing mechanism 43 is a driving mechanism configured to drive the grinding tool D. The grinding tool D is brought into contact with the substrate W and grinds the substrate W. The grinding tool D has, for example, a disk-shaped grinding wheel D1 and a plurality of whetstones D2 arranged in a ring shape on a bottom surface of the grinding wheel D1.

The movable unit 43*a* includes a flange 43*a*1 to which the grinding tool D is mounted, a spindle shaft 43*a*2 having the flange 43*a*1 at a lower end thereof, and a spindle motor 43*a*3 configured to rotate the spindle shaft 43*a*2. The flange 43*a*1 is disposed horizontally, and the grinding tool D is mounted to a bottom surface thereof in a replaceable manner with a fastener E such as a bolt. The fastener E is plural in number, and these fasteners E are arranged at a regular distance therebetween along the periphery of the flange 43*a*1. The spindle shaft 43*a*2 is vertically disposed. The spindle motor 43*a*3 is configured to rotate the spindle shaft 43*a*2, thus allowing the grinding tool D mounted to the flange 43*a*1 to be rotated. A rotation center line R3 of the grinding tool D coincides with a rotation center line of the spindle shaft 43*a*2.

The processing mechanism 43 further includes an elevating unit 43*b* configured to move the movable unit 43*a* up and down. The elevating unit 43*b* includes, for example, a vertical Z-axis guide 43*b*1, a Z-axis slider 43*b*2 configured to be moved along the Z-axis guide 43*b*1, and a Z-axis motor 43*b*3 configured to move the Z-axis slider 43*b*2. The movable unit 43*a* is fixed to the Z-axis slider 43*b*2, and the movable unit 43*a* and the grinding tool D are moved up and down along with the Z-axis slider 43*b*2. The elevating unit 43*b* is further equipped with a position detector 43*b*4 configured to detect the position of the grinding tool D. For example, the position detector 43*b*4 detects, for example, the rotation of the Z-axis motor 43*b*3 to detect the position of the grinding tool D.

The elevating unit 43*b* lowers the grinding tool D from a standby position. The grinding tool D is rotated while being lowered, brought into contact with the top surface of the substrate W being rotated, and grinds the entire top surface of the substrate W. If the thickness of the substrate W reaches a set value, the elevating unit 43*b* stops the descent of the grinding tool D. Thereafter, the elevating unit 43*b* raises the grinding tool D up to the standby position.

Figure 5:
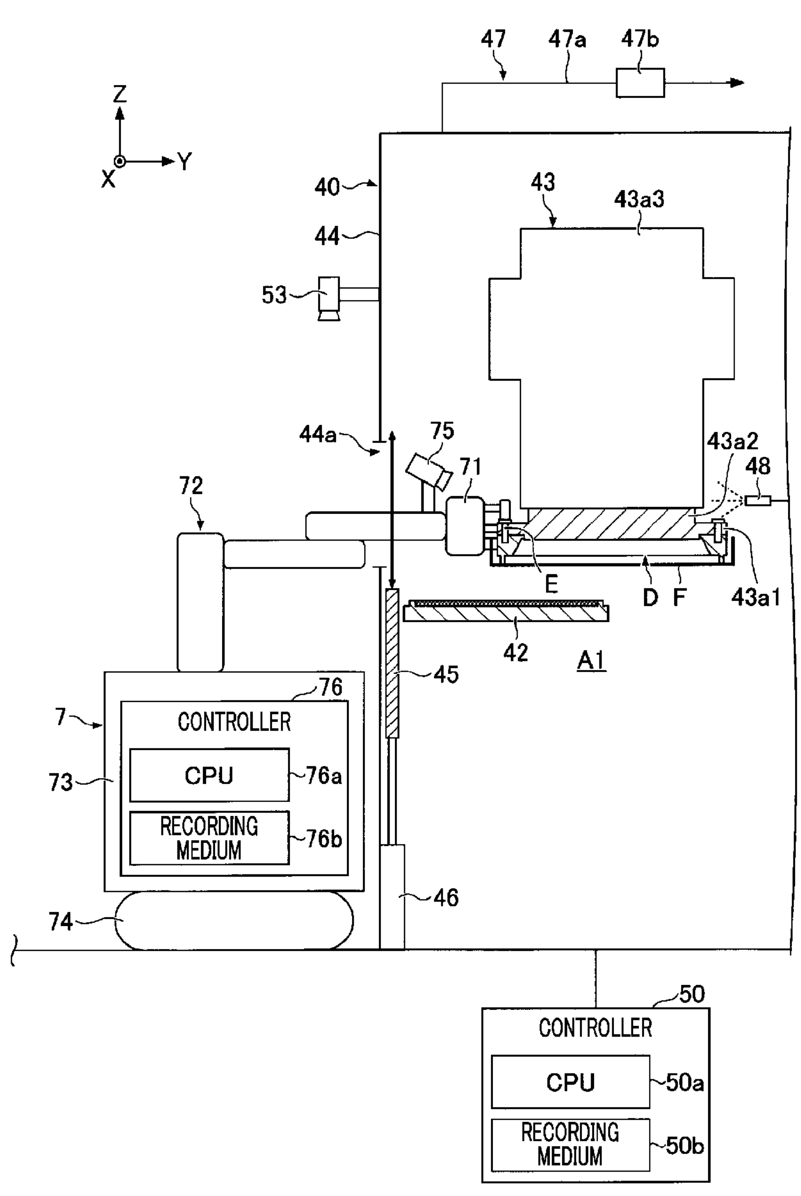
FIG. 5 is a cross sectional view illustrating the grinding apparatus and a replacing apparatus according to the exemplary embodiment.

Now, referring to FIG. 5 and FIG. 6, installation and separation of the grinding tool D to/from the processing mechanism 43 will be described. As shown in FIG. 5, the grinding apparatus 40 includes an exterior cover 44. The exterior cover 44 accommodates the chuck 42 as a holder configured to hold the substrate W and the processing mechanism 43 to which the grinding tool D is installed in a replaceable manner. The exterior cover 44 suppresses particles such as grinding debris generated therein from being flown out. Thus, the factory room can be maintained clean.

The exterior cover 44 has an entrance opening 44*a* through which the replacing apparatus 7 advances into the exterior cover 44 from the outside thereof. Instead of a person, the replacing apparatus 7 advances into the exterior cover 44 from the outside thereof, and replaces the grinding tool D within the exterior cover 44.

Since the replacing apparatus 7 enters the exterior cover 44 instead of a person to replace the grinding tool D, it is possible to suppress the person from getting dirty with deposits within the exterior cover 44. Further, since the replacing apparatus 7 is provided outside the grinding apparatus 40, the grinding apparatus 40 can be scaled down, as compared to a case where the replacing apparatus 7 is provided inside the grinding apparatus 40.

The grinding apparatus 40 is provided with a shutter 45 configured to open or close the entrance opening 44*a* of the exterior cover 44. The shutter 45 basically keeps the entrance opening 44*a* closed, and opens the entrance opening 44*a* when the replacing apparatus 7 enters. As compared to a case where the entrance opening 44*a* is always open, it is possible to suppress an outflow of particles from the inside of the exterior cover 44 to the outside thereof through the entrance opening 44*a*, so that the factory room can be kept clean.

The grinding apparatus 40 may be equipped with a moving mechanism 46 configured to move the shutter 45 between an opening position (for example, the position shown in FIG. 5) where it opens the entrance opening 44*a* and a closing position where it closes the entrance opening 44*a*. The moving mechanism 46 is a pneumatic cylinder, an electric cylinder, or the like. The electric cylinder includes a motor and a ball screw. The shutter 45 can be moved automatically, not manually.

Figure 3:
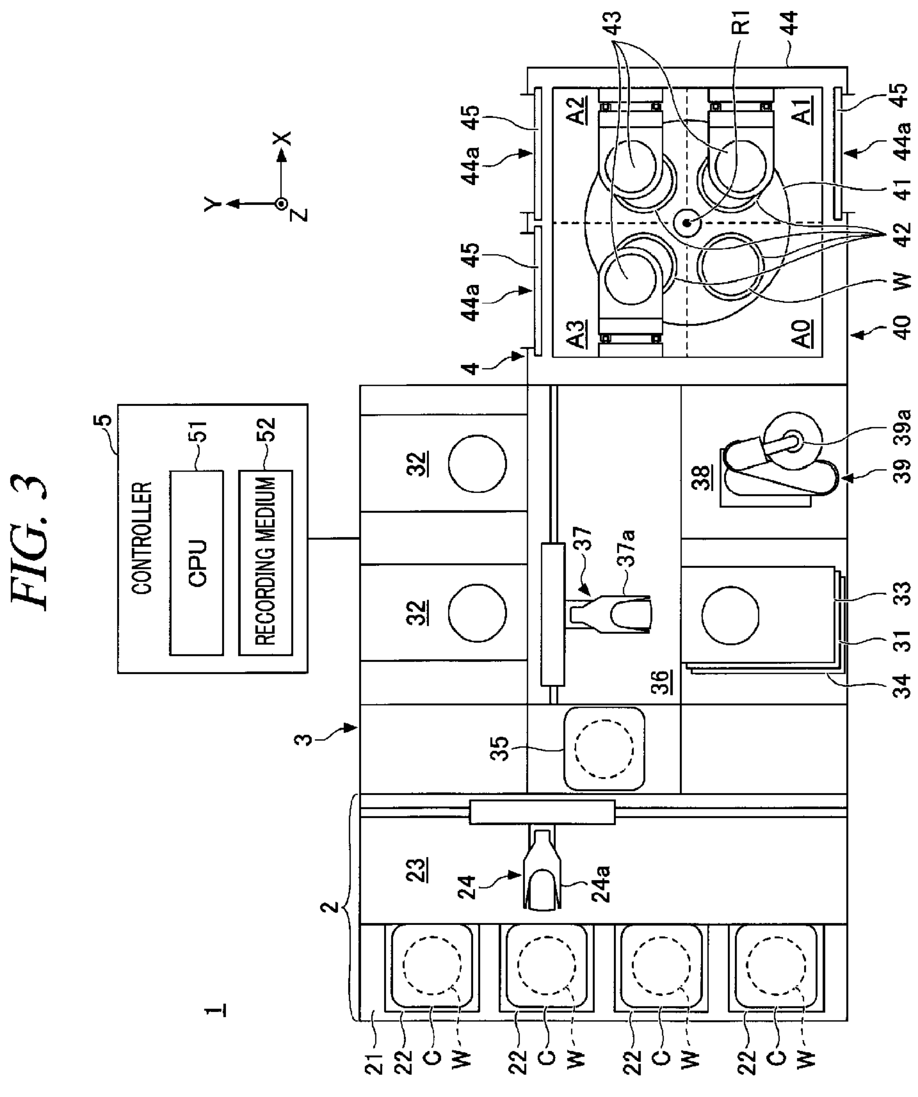
FIG. 3 is a plan view illustrating a grinding system.

As illustrated in FIG. 3, the grinding apparatus 40 is provided with the plurality of processing mechanisms 43, and the entrance opening 44*a* is provided for each of the processing mechanisms 43 individually. For example, the processing mechanism 43 and the entrance opening 44*a* are provided at each of the first grinding position A1, the second grinding position A2 and the third grinding position A3. The shutter 45 is provided for each entrance opening 44*a*, and the shutter 45 is moved for each entrance opening 44*a*.

The effect of providing the replacing apparatus 7 outside the grinding apparatus 40 becomes conspicuous with an increase of the number of the processing mechanisms 43. Unlike in the present exemplary embodiment, if the replacing apparatus 7 is provided inside the grinding apparatus 40 for each processing mechanism 43 individually, or if the replacing apparatus 7 shared by the plurality of processing mechanisms 43 is provided inside the grinding apparatus 40, the grinding apparatus 40 is scaled up. According to the present exemplary embodiment, on the other hand, since the replacing apparatus 7 is provided outside the grinding apparatus 40, the size of the grinding apparatus 40 can be reduced. Here, however, it is also possible that only one processing mechanism 43 is provided.

As illustrated in FIG. 5, the grinding apparatus 40 may be equipped with a restricting mechanism 47. The restricting mechanism 47 is configured to restrict an outflow of a gas from the inside of the exterior cover 44 to the outside through the entrance opening 44*a* of the exterior cover 44. By restricting the outflow of the gas, an outflow of particles can be suppressed, so that the factory room can be kept clean.

By way of example, the restricting mechanism 47 is equipped with an exhaust line 47*a* through which the inside of the exterior cover 44 is set to a negative pressure, as compared to the outside thereof. The exhaust line 47*a* is a duct or the like, and connects the exterior cover 44 to an exhaust source. The exhaust source is, for example, a vacuum pump or an ejector. A pressure controller 47*b*, for example, is provided at a portion of the exhaust line 47*a*. The pressure controller 47*b* is configured to control a pressure within the exterior cover 44. Due to a pressure difference between the inside and the outside of the exterior cover 44, an airflow heading toward the inside of the exterior cover 44 from the entrance opening 44*a* of the exterior cover 44 is formed. As a result, the outflow of the gas from the inside of the exterior cover 44 to the outside thereof can be restricted.

Although a connection opening through which the exhaust line 47*a* is connected to the exterior cover 44 is located above the entrance opening 44*a* of the exterior cover 44 in FIG. 5, it may be provided below the entrance opening 44*a*. In this case, a downflow may be formed inside the exterior cover 44. A blower such as a fan filter unit may be provided at a ceiling of the exterior cover 44. A blowing amount and an exhaust amount are controlled such that the inside of the exterior cover 44 has a negative pressure as compared to the outside thereof.

The grinding apparatus 40 may be equipped with a washing mechanism 48. The washing mechanism 48 supplies a cleaning liquid to the grinding tool D or a member around the grinding tool D by a nozzle or the like. The cleaning liquid is, for example, DIW (deionized water) or the like. The member around the grinding tool D is, for example, the flange 43*a*1 or the spindle shaft 43*a*2. Before removing the used grinding tool D from the processing mechanism 43, the grinding tool D and the like are washed. Thus, the replacing apparatus 7 can be suppressed from becoming dirty. In addition, if the grinding tool D is cleaned by the washing mechanism 48, it is possible to suppress the particles from being moved out together with the grinding tool D.

The grinding apparatus 40 includes a controller 50. The controller 50 is, for example, a computer, and includes a CPU 50*a* and a recording medium 50*b* such as a memory. The recording medium 50*b* stores therein a program for controlling various processings performed in the grinding apparatus 40. The controller 50 controls the operation of the grinding apparatus 40 by causing the CPU 50*a* to execute the program stored in the recording medium 50*b*. The controller 50 of the grinding apparatus 40 may be a part of the controller 5 of the grinding system 1.

The replacing apparatus 7 includes, for example, a replacing mechanism 71, a moving mechanism 72, the traveling table 73, and a traveling mechanism 74. The replacing mechanism 71 is configured to install the grinding tool D to the processing mechanism 43, or separate the grinding tool D from the processing mechanism 43. The replacing mechanism 71 is configured to be movable in horizontal directions (both in the X-axis direction and the Y-axis direction) and in a vertical direction, and pivotable about a vertical axis. The moving mechanism 72 is configured to move the replacing mechanism 71 from the outside of the exterior cover 44 to the inside thereof through the entrance opening 44*a* of the exterior cover 44. The moving mechanism 72 is, for example, a multi-joint arm, which holds the replacing mechanism 71 at one end thereof and is connected to the traveling table 73 at the other end thereof. The traveling table 73 supports the moving mechanism 72. The traveling mechanism 74 is configured to cause the traveling table 73 to travel.

Since the replacing apparatus 7 is provided outside the grinding apparatus 40, the self-propelled robot is used as the replacing apparatus 7, unlike a case where the replacing apparatus 7 is provided inside the grinding apparatus 40. Instead of a person, the replacing apparatus 7 replaces the grinding tool D. Therefore, it is possible to suppress the people from getting dirty. In addition, since the replacing apparatus 7 is provided outside the grinding apparatus 40, the size of the grinding apparatus 40 can be reduced, as compared to the case where the replacing apparatus 7 is provided inside the grinding apparatus 40.

Figure 6:
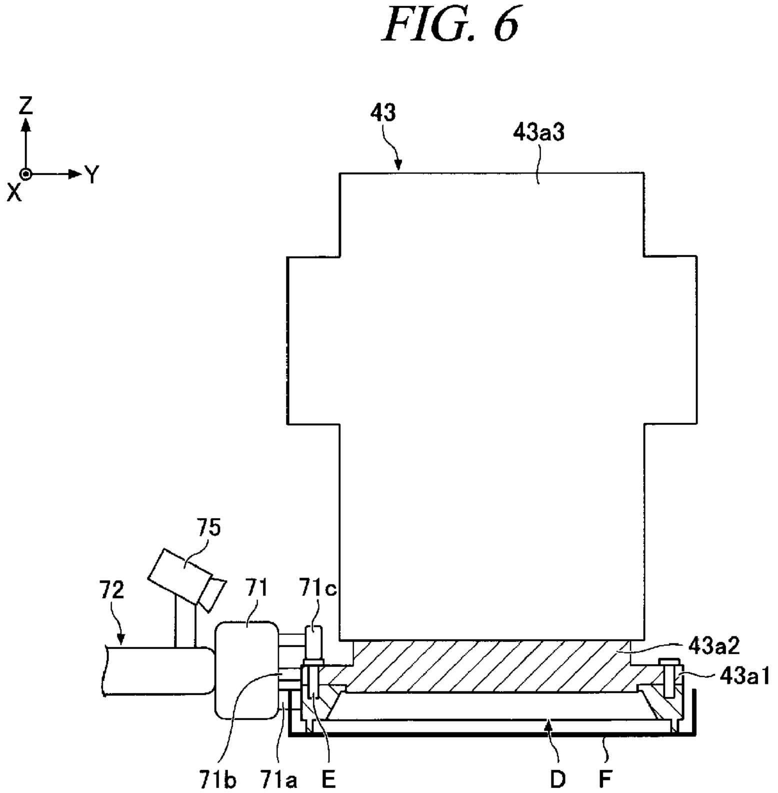
FIG. 6 is an enlarged cross section view illustrating a part of FIG. 5.

As shown in FIG. 6, the replacing mechanism 71 has a holding mechanism 71*a* configured to hold the grinding tool D. The holding mechanism 71*a* holds a container F for accommodating therein the grinding tool D. The container F is of a box shape with an open top, and has a recessed portion in a top surface thereof. The grinding tool D is accommodated in this recessed portion. The container F accommodates therein the grinding tool D, and suppresses a grinding liquid, grinding debris, and the like from falling down when the grinding tool D is separated. Further, the holding mechanism 71*a* may be configured to hold the grinding tool D itself.

The replacing mechanism 71 has a rotation stopping mechanism 71*b* configured to stop the rotation of the spindle shaft 43*a*2 of the processing mechanism 43. The rotation stopping mechanism 71*b* includes, for example, a clamp configured to hold the flange 43*a*1 or the spindle shaft 43*a*2. Alternatively, the rotation stopping mechanism 71*b* includes a pin to be inserted into a hole of the flange 43*a*1 or the spindle shaft 43*a*2. In the state that the rotation of the spindle shaft 43*a*2 is stopped by the rotation stopping mechanism 71*b* and the rotation of the grinding tool D is thus stopped, the fastener E may be tightened or loosened.

The replacing mechanism 71 has a manipulating mechanism 71*c* configured to tighten or loosen the fastener E configured to fasten the grinding tool D and the processing mechanism 43. When the fastener E is a bolt, the manipulating mechanism 71*c* is composed of a tool such as a spanner or a wrench to be engaged with the bolt and a rotating mechanism configured to rotate the tool.

As shown in FIG. 1, etc., the set of the replacing mechanism 71 and the moving mechanism 72 may be provided in plurality and controlled independently. One set is used for the installation of the grinding tool D, and another set is used for the separation of the grinding tool D. If the set of the replacing mechanism 71 and the moving mechanism 72 is plural in number, the separation and the installation of the grinding tool D can be promptly performed in succession, unlike a case where only one set is provided. That is, the replacing apparatus 7 does not need to be moved back and forth between the grinding apparatus 40 and the storage 9 between the separation and the installation of the grinding tool D.

In addition, if the storage 9 (see FIG. 11) of the replacing apparatus 7 stores both the used grinding tool D and the unused grinding tool D, the installation and the separation of the grinding tools D can be carried out promptly in succession even though only one replacing mechanism 71 and moving mechanism 72 are provided. Further, if the storage 9 (see FIG. 11) of the replacing apparatus 7 stores both a plurality of used grinding tools D and a plurality of unused grinding tools D, the replacing apparatus 7 can carry out the replacing operation for the plurality of processing mechanisms 43 successively without being moved back and forth between the storage 9 (see FIG. 1 and FIG. 2) provided outside it and the grinding apparatus 40.

The replacing apparatus 7 may be equipped with an imaging device 75 configured to image the replacing mechanism 71. The imaging device 75 is mounted to the one end of the moving mechanism 72, the same as the replacing mechanism 71. Thus, it is possible to control the replacing mechanism 71 while monitoring the operation of the replacing mechanism 71 with the imaging device 75.

The replacing apparatus 7 is equipped with a controller 76. The controller 76 is, for example, a computer, and includes a CPU 76*a* and a recording medium 76*b* such as a memory. The recording medium 76*b* stores therein a program for controlling various processings performed in the replacing apparatus 7. The controller 76 controls the operation of the replacing apparatus 7 by causing the CPU 76*a* to execute the program stored in the recording medium 76*b*.

Figure 7:
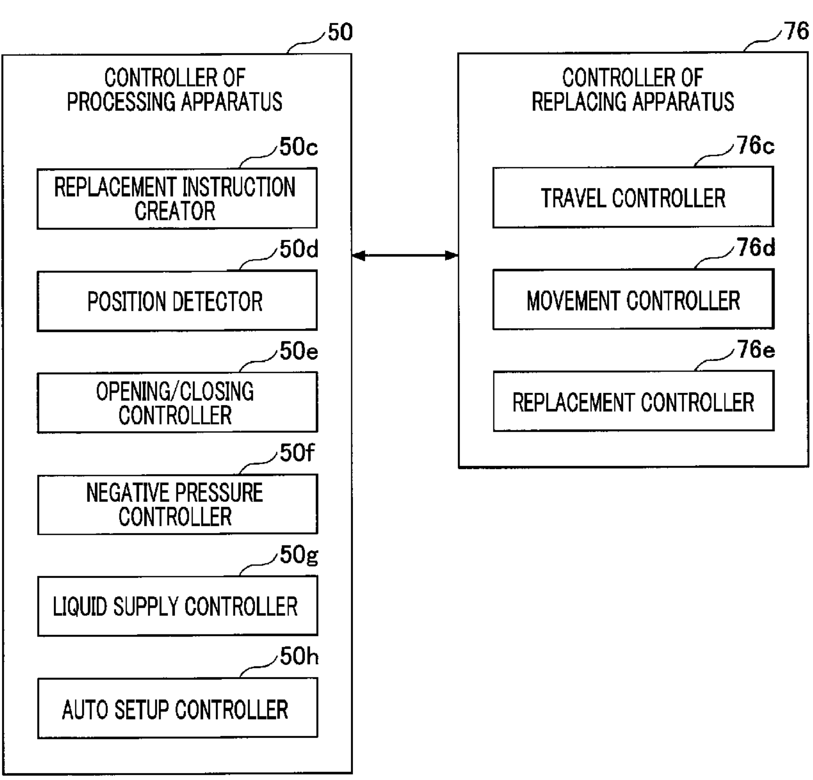
FIG. 7 is a functional block diagram illustrating constituent components of controllers of the grinding apparatus and the replacing apparatus according to the exemplary embodiment.

Now, referring to FIG. 7, the function of the controller 50 of the grinding apparatus 40 and the function of the controller 76 of the replacing apparatus 7 will be explained. Further, individual functional blocks shown in FIG. 7 are conceptual and may not necessarily be physically configured exactly the same as shown in FIG. 7. All or a part of the functional blocks may be functionally or physically dispersed or combined on a unit. All or a part of processing functions performed in the respective functional blocks may be implemented by a program executed by the CPU or implemented by hardware through a wired logic.

First, the function of the controller 50 of the grinding apparatus 40 will be described. The controller 50 includes, by way of example, a replacement instruction creator 50*c*, a position detector 50*d*, an opening/closing controller 50*e*, a negative pressure controller 50*f*, a cleaning controller 50*g*, and an auto setup controller 50*h*.

The replacement instruction creator 50*c* is configured to determine whether the replacement of the grinding tool D is necessary, and create a replacement instruction for the grinding tool D. Specifically, the replacement instruction creator 50*c* monitors, for example, the number of substrates W ground by the grinding tool D, the wear amount of the grinding tool D, or the elapsed time after the grinding tool D is installed. When the monitored value reaches a set value, the replacement instruction creator 50*c* creates the replacement instruction. The created replacement instruction is transmitted to the controller 76 of the replacing apparatus 7 in a wireless or wired manner. The replacing apparatus 7 and the grinding apparatus 40 may transmit/receive signals via an external computer. The replacing apparatus 7 is moved to the grinding apparatus 40 in response to the replacement instruction, that is, a request from the grinding apparatus 40.

The position detector 50*d* is configured to detect, with a sensor 53, whether or not the traveling table 73 of the replacing apparatus 7 has arrived at a position (for example, the position shown in FIG. 5) at which the grinding tool D is to be replaced. The position where the grinding tool D is to be replaced is set outside the exterior cover 44, and serves as both a position where the grinding tool D is installed and a position where the grinding tool D is separated. The sensor 53 is configured to detect, for example, the arrival of the traveling table 73 of the replacing apparatus 7 at the set position outside the exterior cover 44. The sensor 53 is mounted to, for example, an outer wall surface of the exterior cover 44 to be located above the entrance opening 44*a*. The sensor 53 is, for example, a camera or the like.

The opening/closing controller 50*e* is configured to control the moving mechanism 46 of the shutter 45 and control the position of the shutter 45. If the traveling table 73 of the replacing apparatus 7 arrives at the position where the grinding tool D is to be replaced, the opening/closing controller 50*e* changes the position of the shutter 45 from the closing position to the opening position. Further, if the traveling table 73 of the replacing apparatus 7 is retreated from the position at which the grinding tool D is replaced, the opening/closing controller 50*e* changes the position of the shutter 45 from the opening position to the closing position.

The negative pressure controller 50*f* is configured to control the pressure controller 47*b* of the exhaust line 47*a* to turn the inside of the exterior cover 44 into a negative pressure as compared to the outside. The negative pressure controller 50*f* sets the inside of the exterior cover 44 to be the negative pressure as compared to the outside of the exterior cover 44, at least while the shutter 45 maintains the entrance opening 44*a* of the exterior cover 44 opened.

The cleaning controller 50*g* is configured to control the washing mechanism 48 to supply the cleaning liquid to the grinding tool D or the member around the grinding tool D before the shutter 45 opens the entrance opening 44*a* of the exterior cover 44. The supply of the cleaning liquid may be performed after the replacement instruction for the grinding tool D is created, for example. In addition, the supply of the cleaning liquid may also be performed during the grinding or at the end of the grinding of the substrate W.

The auto setup controller 50*h* is configured to perform an auto setup when the replacement of the grinding tool D is completed and the replacing apparatus 7 is retreated from the position at which the grinding tool D is replaced. The auto setup includes, for example, dressing of the unused grinding tool D, or temperature adjustment of the inside of the exterior cover 44.

Now, the function of the controller 76 of the replacing apparatus 7 will be discussed. The controller 76 includes, for example, a travel controller 76*c*, a movement controller 76*d*, and a replacement controller 76*e*.

The travel controller 76*c* is configured to control the traveling mechanism 74 and control the position of the traveling table 73. For example, the travel controller 76*c* controls the traveling mechanism 74 to move the traveling table 73 between the position where the grinding tool D is stored and the position where the grinding tool D is to be replaced.

The movement controller 76*d* is configured to control the moving mechanism 72, and control the position of the replacing mechanism 71. If the replacing apparatus 7 detects, through the signal transmitted from the grinding apparatus 40, a state in which the traveling table 73 is stopped at the position where the grinding tool D is to be replaced and the entrance opening 44*a* of the exterior cover 44 is opened, the movement controller 76*d* moves the replacing mechanism 71 from the outside of the exterior cover 44 to the inside thereof through the entrance opening 44*a* of the exterior cover 44. Further, before the traveling table 73 is retreated from the position where the grinding tool D is to be replaced, the movement controller 76*d* moves the replacing mechanism 71 from the inside of the exterior cover 44 to the outside thereof through the entrance opening 44*a* of the exterior cover 44.

The replacement controller 76*e* is configured to control the replacing mechanism 71, and control the separation or installation of the grinding tool D. The replacement controller 76*e* causes the manipulating mechanism 71*c* to tighten or loosen the fastener E in the state that the grinding tool D is held by the holding mechanism 71*a* and the rotation of the spindle shaft 43*a*2 is stopped by the rotation stopping mechanism 71*b*. The replacement controller 76*e* controls the replacing mechanism 71 while monitoring the operation of the replacing mechanism 71 with the imaging device 75.

Now, the operations of the grinding apparatus 40 and the replacing apparatus 7 will be briefly explained. The grinding apparatus 40 makes the determination upon whether the replacement of the grinding tool D is necessary, and creates the replacement instruction for the grinding tool D. Then, the grinding apparatus 40 transmits the created replacement instruction to the replacing apparatus 7. Further, if it is determined that the replacement of the grinding tool D is necessary, the grinding apparatus 40 stops the grinding of the substrate W and performs the cleaning by the washing mechanism 48. Meanwhile, if the replacing apparatus 7 receives the replacement instruction from the grinding apparatus 40, it approaches the grinding apparatus 40. If the grinding apparatus 40 detects the arrival of the traveling table 73 of the replacing apparatus 7 at the position at which the grinding tool D is to be replaced, the grinding apparatus 40 opens the shutter 45. Thereafter, the replacing apparatus 7 makes the replacing mechanism 71 advance into the exterior cover 44 through the entrance opening 44*a* thereof. Next, the replacing apparatus 7 separates the used grinding tool D from the processing mechanism 43, and installs the unused grinding tool D to the processing mechanism 43. Thereafter, the replacing apparatus 7 retreats the replacing mechanism 71 to the outside through the entrance opening 44*a* of the exterior cover 44. Afterwards, the grinding apparatus 40 closes the shutter 45 and performs the auto setup control. Subsequently, the grinding apparatus 40 resumes the grinding of the substrate W.

Now, referring to FIG. 8, the grinding apparatus 40 and the replacing apparatus 7 according to a first modification example will be described. Hereinafter, the description will mainly focus on differences from the above-described exemplary embodiment.

The restricting mechanism 47 of the grinding apparatus 40 according to the first modification example has a seal member 47*c* in addition to the exhaust line 47*a*. Here, it may also be possible that the restricting mechanism 47 has only the seal member 47*c*. The seal member 47*c* comes into contact with the multi-joint arm of the replacing apparatus 7 that has entered the entrance opening 44*a* of the exterior cover 44, thus closing the entrance opening 44*a* of the exterior cover 44. The seal member 47*c* serves to restrict the outflow of the gas, thus suppressing the outflow of the particles.

The seal member 47*c* is provided to, for example, the shutter 45, and is moved along with the shutter 45. The shutter 45 is provided in a pair, and the seal member 47*c* is attached to each of facing surfaces of the pair of shutters 45. The pair of seal members 47*c* surround the replacing apparatus 7 interposed therebetween, thus closing the entrance opening 44*a* of the exterior cover 44. The seal member 47*c* is formed of a flexible material such as rubber, and is transformed according to the shape of the replacing apparatus 7.

If the traveling table 73 of the replacing apparatus 7 reaches the set position outside the exterior cover 44, the opening/closing controller 50*e* changes the position of the shutter 45 from the closing position to the opening position. Thereafter, the movement controller 76*d* moves the replacing mechanism 71 from the outside of the exterior cover 44 to the inside thereof through the entrance opening 44*a* of the exterior cover 44. At this time, the seal member 47*c* is not in contact with the replacing apparatus 7.

Figure 8:
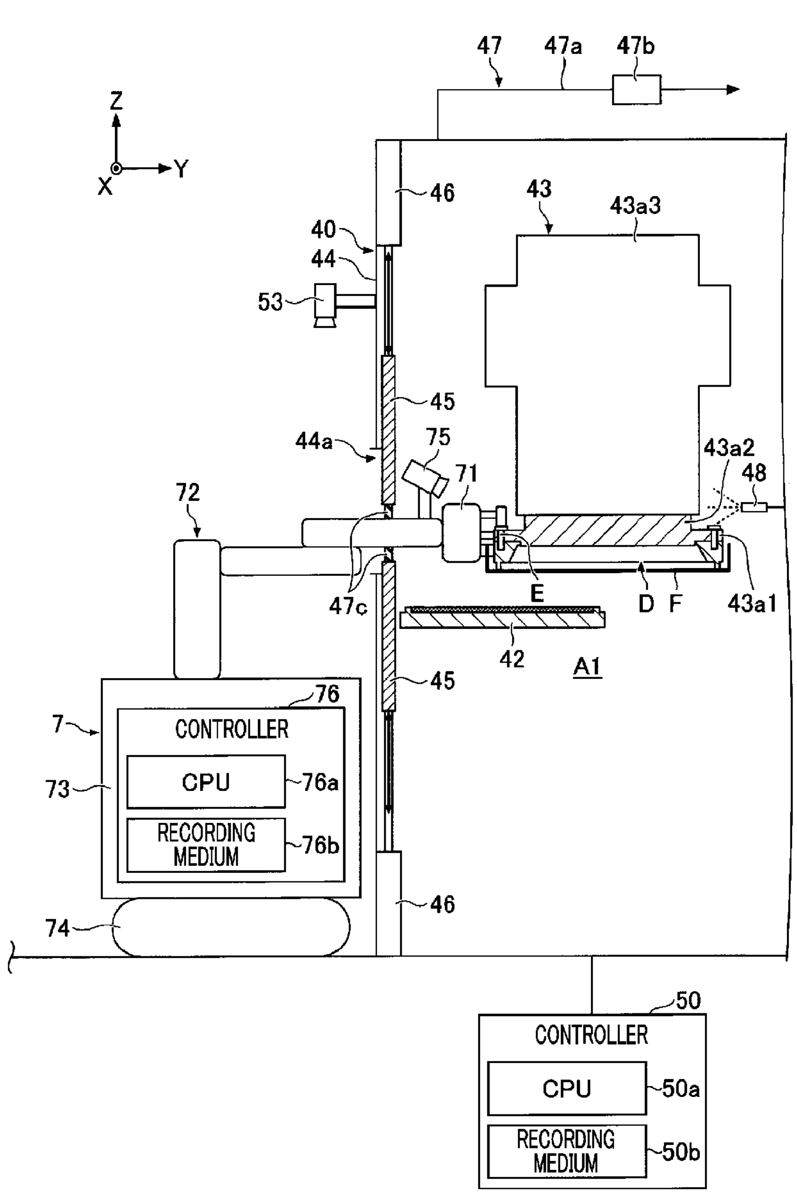
FIG. 8 is a cross sectional view illustrating the grinding apparatus and the replacing apparatus according to a first modification example.

Then, the opening/closing controller 50*e* changes the position of the shutter 45 from the opening position to a sealing position (for example, the position shown in FIG. 8). The sealing position is a position where the seal member 47*c* comes into contact with the multi-join arm of the replacing apparatus 7 or the like to close the entrance opening 44*a* of the exterior cover 44. With the entrance opening 44*a* sealed by the seal member 47*c*, the replacement controller 76*e* controls the replacing mechanism 71 to separate or install the grinding tool D.

Upon the completion of the separation or installation of the grinding tool D, the opening/closing controller 50*e* changes the position of the shutter 45 from the sealing position to the opening position. Subsequently, the movement controller 76*d* moves the replacing mechanism 71 from the inside of the exterior cover 44 to the outside thereof through the entrance opening 44*a* of the exterior cover 44. Thereafter, the travel controller 76*c* controls the traveling mechanism 74 to move the traveling table 73 from the position where the grinding tool D is replaced to the position where the grinding tool D is stored.

Now, referring to FIG. 9, the grinding apparatus 40 and the replacing apparatus 7 according to a second modification example will be described. Hereinafter, the description will mainly focus on differences from the above-described exemplary embodiment and first modification example.

The exterior cover 44 of the grinding apparatus 40 according to the second modification example includes a main housing 44*b* where the entrance opening 44*a* is formed, and a sub-housing 44*c* mounted to an outer wall surface of the main housing 44*b* so as to surround the entrance opening 44*a* of the main housing 44*b*. The main housing 44*b* accommodates therein the chuck 42 as the holder configured to hold the substrate W and the processing mechanism 43 to which the grinding tool D is installed in a replaceable manner.

The sub-housing 44*c* includes a second entrance opening 44*d* through which the replacing apparatus 7 passes when it advances into the sub-housing 44*c* from the outside thereof. After arriving at the position to replace the grinding tool D, the replacing apparatus 7 passes through the second entrance opening 44*d* and the entrance opening 44*a* in this order, advances into the main housing 44*b*, and replaces the grinding tool D within the main housing 44*b*.

The grinding apparatus 40 is equipped with a second shutter 61 configured to open or close the second entrance opening 44*d* of the sub-housing 44*c*. The second shutter 61 basically keeps the second entrance opening 44*d* closed, and opens the second entrance opening 44*d* when the replacing apparatus 7 enters. As compared to a case where the second entrance opening 44*d* is always open, it is possible to suppress the outflow of the particles from the inside of the exterior cover 44 to the outside thereof through the second entrance opening 44*d*, so that the factory room can be kept clean.

The grinding apparatus 40 may be further equipped with a second moving mechanism 62 configured to move the second shutter 61 between a second opening position where the shutter 61 opens the second entrance opening 44*d* and a second closing position where the shutter 61 closes the second entrance opening 44*d*. The second moving mechanism 62 is, by way of non-limiting example, a pneumatic cylinder, an electric cylinder, or the like. The second shutter 61 can be moved automatically, not manually.

Like the entrance opening 44*a*, the second entrance opening 44*d* is provided for each processing mechanism 43. For example, the second entrance opening 44*d* may be provided at each of the first grinding position A1, the second grinding position A2, and the third grinding position A3. The second shutter 61 is provided for each second entrance opening 44*d* to be moved for the corresponding second entrance opening 44*d*.

The controller 50 of the grinding apparatus 40 is equipped with a non-illustrated second opening/closing controller. The second opening/closing controller controls the second moving mechanism 62, and controls the position of the second shutter 61. When the traveling table 73 of the replacing apparatus 7 arrives at the position to replace the grinding tool D, the second opening/closing controller changes the position of the second shutter 61 from the second closing position to the second opening position. Further, when the traveling table 73 of the replacing apparatus 7 is retreated from the position where the grinding tool D is replaced, the second opening/closing controller changes the position of the second shutter 61 from the second opening position to the second closing position.

The restricting mechanism 47 of the grinding apparatus 40 may have a second seal member 47*d*. The second seal member 47*d* comes into contact with the multi-joint arm of the replacing apparatus 7 that has entered the second entrance opening 44*d* of the sub-housing 44*c*, thus closing the second entrance opening 44*d* of the sub-housing 44*c*. With the second seal member 47*d*, the outflow of the gas can be restricted, so that the outflow of the particles can be suppressed.

The second seal member 47*d* is provided to, for example, the second shutter 61, and is moved along with the second shutter 61. The second shutters 61 is provided in a pair, and the second seal member 47*d* is attached to each of facing surfaces of the pair of second shutters 61. The pair of second seal members 47*d* surround the replacing apparatus 7 interposed therebetween, thus closing the second entrance opening 44*d* of the exterior cover 44. The second seal member 47*d* is made of a flexible material such as rubber, and is transformed according to the shape of the replacing apparatus 7.

If the traveling table 73 of the replacing apparatus 7 reaches the set position outside the exterior cover 44, the second opening/closing controller changes the position of the second shutter 61 from the second closing position to the second opening position. Thereafter, the movement controller 76*d* moves the replacing mechanism 71 from the outside of the sub-housing 44*c* to the inside thereof through the second entrance opening 44*d* of the sub-housing 44*c*. At this time, the second seal member 47*d* is not in contact with the replacing apparatus 7.

Figure 9:
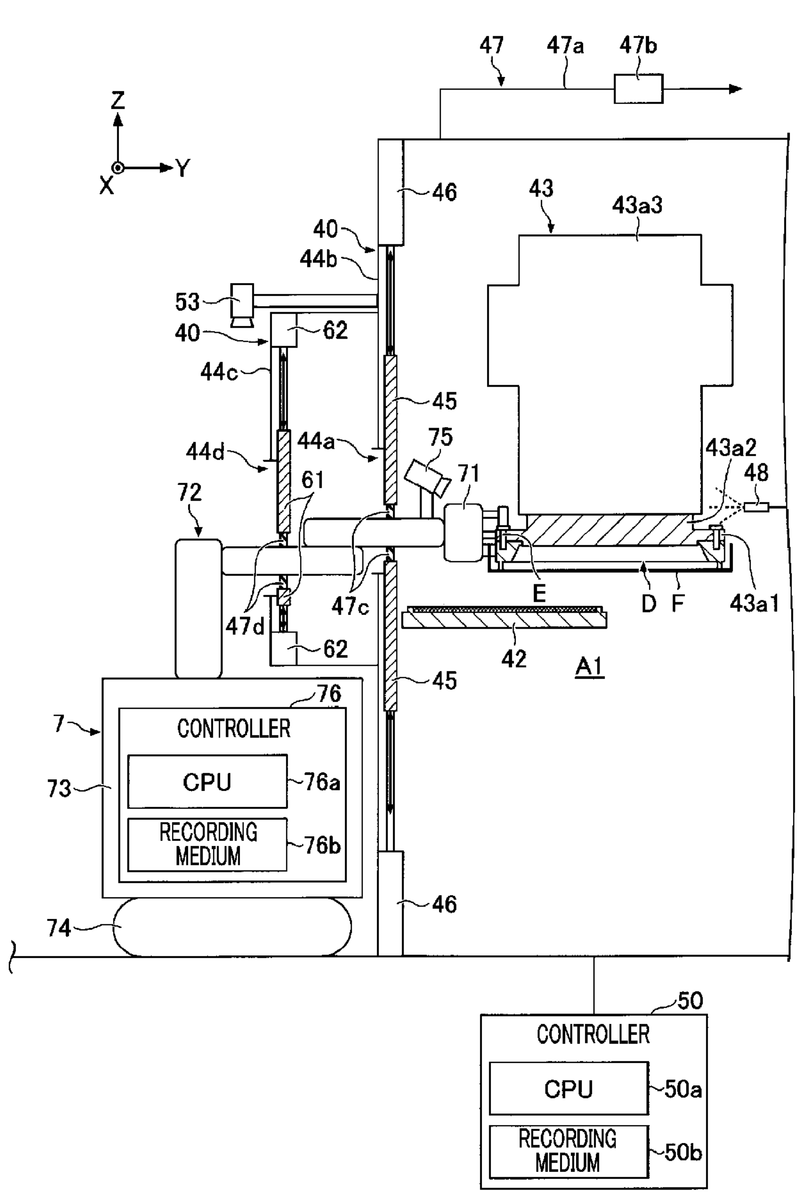
FIG. 9 is a cross sectional view illustrating the grinding apparatus and the replacing apparatus according to a second modification example.

Thereafter, the second opening/closing controller changes the position of the second shutter 61 from the second opening position to a second sealing position (for example, the position shown in FIG. 9). The second sealing position is a position where the second seal member 47*d* comes into contact with the multi-joint arm of the replacing apparatus 7 or the like to close the second entrance opening 44*d* of the sub-housing 44*c*. With the second entrance opening 44*d* closed by the second sealing member 47*d*, the opening/closing controller 50*e* changes the position of the shutter 45 from the closing position to the opening position. Next, the movement controller 76*d* moves the replacing mechanism 71 from the outside of the main housing 44*b* to the inside thereof through the entrance opening 44*a* of the main housing 44*b*. Subsequently, the opening/closing controller 50*e* changes the position of the shutter 45 from the opening position to the sealing position. Then, the replacement controller 76*e* controls the replacing mechanism 71 to separate or install the grinding tool D. Further, in case that the second seal member 47*d* is provided to the second shutter 61, the outflow of the particles can be suppressed if the second seal member 47*d* closes the second entrance opening 44*d* of the sub-housing 44*c*. Therefore, the seal member 47*c* may be omitted. If, however, the seal member 47*c* is also provided, the outflow of the particles can be further suppressed.

Upon the completion of the separation or installation of the grinding tool D, the opening/closing controller 50*e* changes the position of the shutter 45 from the sealing position to the opening position. Then, the movement controller 76*d* moves the replacing mechanism 71 from the inside of the main housing 44*b* to the outside thereof through the entrance opening 44*a* of the main housing 44*b*. Next, the opening/closing controller 50*e* changes the position of the shutter 45 from the opening position to the closing position. Thereafter, the second opening/closing controller changes the position of the second shutter 61 from the second sealing position to the second opening position. Subsequently, the movement controller 76*d* moves the replacing mechanism 71 from the inside of the sub-housing 44*c* to the outside thereof through the second entrance opening 44*d* of the sub-housing 44*c*. Thereafter, the travel controller 76*c* controls the traveling mechanism 74 to move the traveling table 73 from the position where the grinding tool D is replaced to the position where the grinding tool D is stored. In this way, by closing at least one of the entrance opening 44*a* and the second entrance opening 44*d* without opening them at the same time, it is possible to suppress the inside of the main housing 44*b* from being opened to the outside of the grinding apparatus 40.

Figure 10:
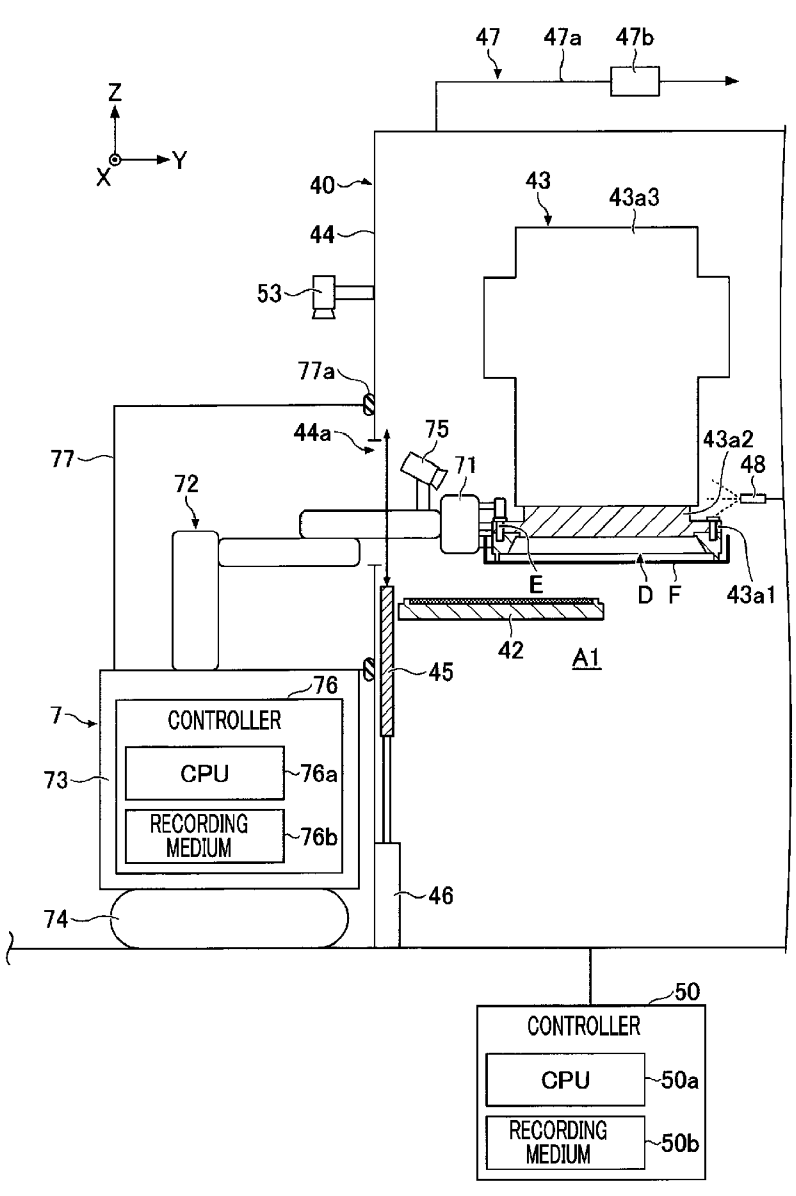
FIG. 10 is a cross sectional view illustrating the grinding apparatus and the replacing apparatus according to a third modification example.

Now, referring to FIG. 10, the grinding apparatus 40 and the replacing apparatus 7 according to a third modification example will be described. Hereinafter, the description will mainly focus on the differences from the above-described exemplary embodiment, first modification example, and second modification example.

The replacing apparatus 7 of the present modification examples includes a housing 77 mounted to the traveling table 73. The housing 77 is configured to come into contact with the outer wall surface of the exterior cover 44 in the state the replacing mechanism 71 and the moving mechanism 72 are accommodated therein, thus sealing the inside of the housing 77. The housing 77 may have a seal member 77*a* on a surface thereof in contact with the exterior cover 44.

If the shutter 45 opens the entrance opening 44*a* of the exterior cover 44, the inside of the housing 77 communicates with the inside of the exterior cover 44 through the entrance opening 44*a* of the exterior cover 44. In this state, the replacement of the grinding tool D is performed. With this housing 77, the outflow of the gas can be restricted and the outflow of the particles can thus be suppressed. Therefore, the factory room can be kept clean.

In addition, as illustrated in FIG. 9, when the exterior cover 44 has the main housing 44*b* and the sub-housing 44*c*, the housing 77 is in contact with an outer wall surface of the sub-housing 44*c*. If the second shutter 61 opens the second entrance opening 44*d* of the sub-housing 44*c* and the shutter 45 opens the entrance opening 44*a* of the main housing 44*b*, the inside of the housing 77 and the inside of the main housing 44*b* communicate with each other.

Meanwhile, as illustrated in FIG. 6, the processing mechanism 43 includes a mounting member (for example, the flange 43*a*1) to which the grinding tool D is mounted in a replaceable manner; and the fastener E configured to fasten the grinding tool D and the flange 43*a*1. The fastener E is, for example, a bolt. The fastener E fastens the flange 43*a*1 and the grinding tool D from above the flange 43*a*1. By way of example, the fastener E is inserted through a straight hole penetrating the flange 43*a*1 in an up-down direction and screwed into a screw hole formed in a top surface of the grinding tool D (specifically, the grinding wheel D1). The manipulation of the fastener E is performed by the manipulating mechanism 71*c*. The manipulating mechanism 71*c* tightens or loosens the fastener E above the flange 43*a*1, as shown in FIG. 6.

A cover or the like covering the spindle shaft 43*a*2 may be provided above the flange 43*a*1 to protect the spindle shaft 43*a*2 from the grinding liquid containing grinding debris. If the cover or the like is provided, however, it would become difficult for the manipulating mechanism 71*c* to advance to a space above the flange 43*a*1, which makes the manipulation of the fastener E difficult.

Figure 12:
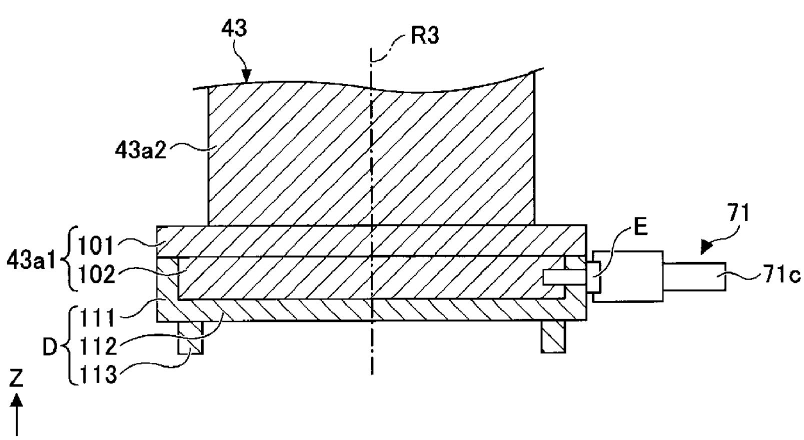
FIG. 12 is a cross sectional view illustrating a first modification example of a fastener.
Figure 13:
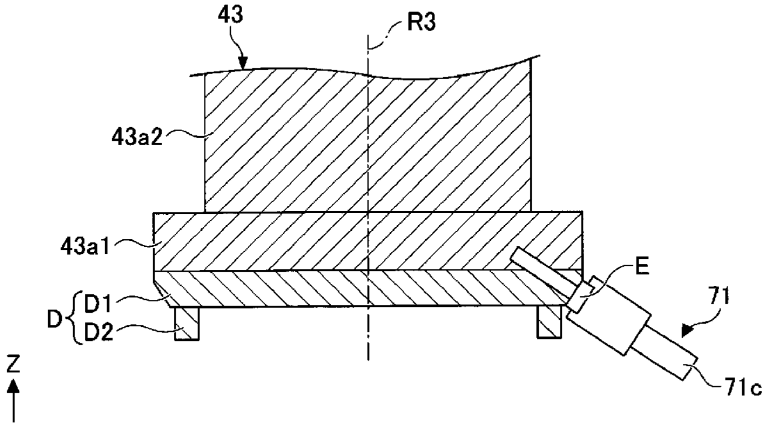
FIG. 13 is a cross sectional view illustrating a second modification example of the fastener.

As a resolution, the fastener E may fasten the flange 43*a*1 and the grinding tool D from the side of the flange 43*a*1, as depicted in FIG. 12. Alternatively, as shown in FIG. 13, the fastener E may fasten the flange 43*a*1 and the grinding tool D from obliquely below the flange 43*a*1. In either case, the manipulating mechanism 71*c* does not advance to the space above the flange 43*a*1, so that the manipulating mechanism 71*c* can easily manipulate the fastener E even when the cover or the like is provided above the flange 43*a*1.

As shown in FIG. 12, the flange 43*a*1 includes, by way of example, a disk-shaped upper flange 101 and a disk-shaped lower flange 102 having an outer diameter smaller than that of the upper flange 101. Meanwhile, the grinding tool D includes a ring portion 111 in which the lower flange 102 is fitted; a disk portion 112 blocking the bottom of the ring portion 111; and a plurality of whetstones 113 arranged along the outer periphery of the disk portion 112.

As shown in FIG. 12, the axial direction of the fastener E may be orthogonal to the rotation center line R3 of the spindle shaft 43*a*2. For example, the fastener E is inserted into a straight hole penetrating the grinding tool D (specifically, the ring portion 111) in a diametrical direction, and is screwed into a screw hole formed in an outer peripheral surface of the flange 43*a*1 (specifically, the lower flange 102).

Alternatively, as illustrated in FIG. 13, the axial direction of the fastener E may be inclined downwards as it goes away from the rotation center line R3 of the spindle shaft 43*a*2. For example, the fastener E is inserted into a straight hole penetrating the grinding tool D obliquely, and is screwed into a screw hole formed in a bottom surface of the flange 43*a*1.

Figure 14:
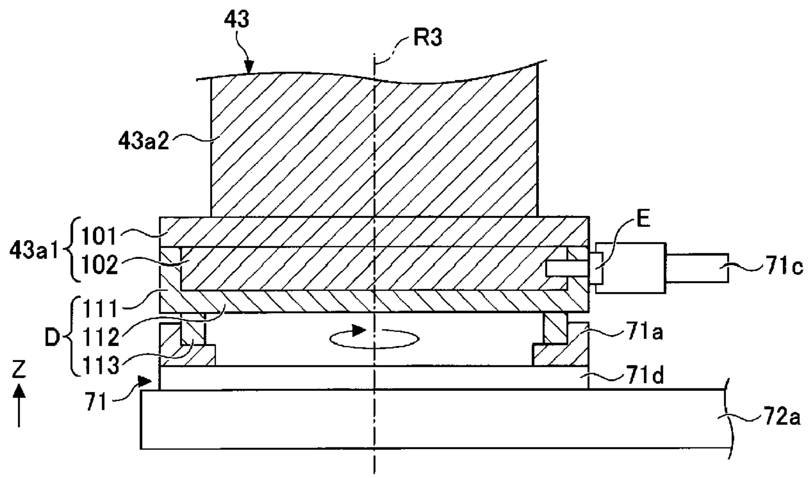
FIG. 14 is a cross sectional view illustrating an example of a first rotating mechanism.

As depicted in FIG. 14, the replacing mechanism 71 has the holding mechanism 71*a* (i.e., a support member) configured to hold the grinding tool D. The holding mechanism 71*a* holds the grinding tool D from below, for example. The holding mechanism 71*a* is provided at a leading end of the multi-joint arm 72*a* with a first rotating mechanism 71*d* (i.e., a first rotator member) to be described later therebetween, for example. The leading end of the multi-joint arm 72*a* advances into a space below the processing mechanism 43 sideways, and is lifted upwards. Then, the holding mechanism 71*a* comes into contact with the grinding tool D and holds it.

The replacing mechanism 71 may be equipped with the first rotating mechanism 71*d* configured to rotate the holding mechanism 71*a*. When the holding mechanism 71*a* holds the grinding tool D, a rotation center line of the holding mechanism 71*a* coincides with the rotation center line R3 of the spindle shaft 43*a*2. As the first rotating mechanism 71*d* rotates the holding mechanism 71*a*, the grinding tool D and the flange 43*a*1 can be rotated simultaneously, and the fastener E can be directed toward the manipulating mechanism 71*c*. Therefore, the operation of the manipulating mechanism 71*c* can be simplified.

When the plurality of fasteners E are provided at a regular distance therebetween in a circumferential direction of the grinding tool D, the controller 76 repeatedly performs the rotation of the holding mechanism 71*a* by the first rotating mechanism 71*d* and the loosening of the fasteners E by the manipulating mechanism 71*c*. Before the manipulating mechanism 71*c* loosens the fastener E, the rotation of the holding mechanism 71*a* is stopped so that the fastener E is directed toward the manipulating mechanism 71*c*. At this time, the controller 76 may monitor the position of the fastener E by using the imaging device 75 shown in FIG. 6, determine whether the position of the fastener E is a required position, and control a rotation stop position of the holding mechanism 71*a*. If all the fasteners E are separated, the coupling between the grinding tool D and the processing mechanism 43 is released.

Figure 15:
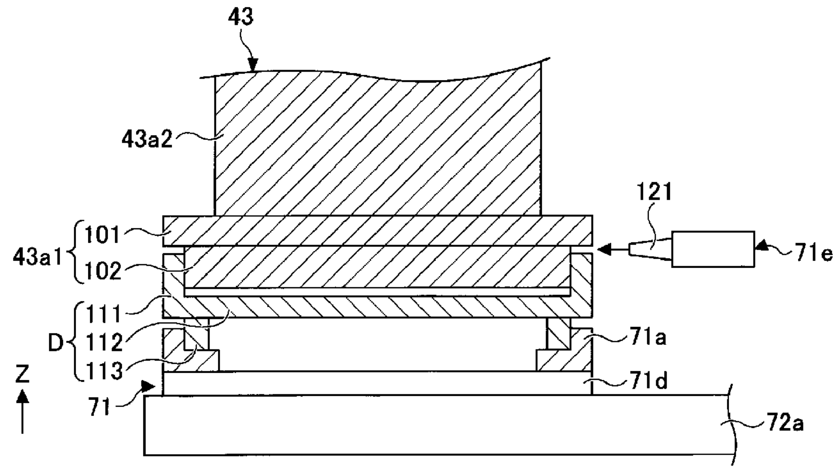
FIG. 15 is a cross sectional view illustrating an example of a gas supply mechanism.

The replacing mechanism 71 may have a gas supply mechanism 71*e* configured to supply a gas between the grinding tool D and the processing mechanism 43, as shown in FIG. 15, in order to support the separation of the grinding tool D and the processing mechanism 43. The gas supply mechanism 71*e* includes a nozzle 121 configured to discharge the gas. The nozzle 121 supplies the gas into a gap between a bottom surface of the upper flange 101 and a top surface of the ring portion 111, for example. The grinding tool D and the processing mechanism 43 can be easily separated due to a wind pressure of the gas.

Figure 16:
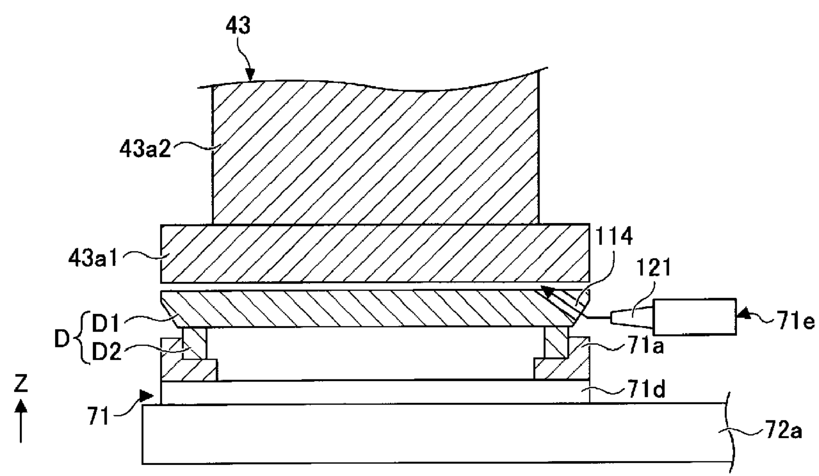
FIG. 16 is a cross sectional view illustrating another example of a gas supply mechanism.

The grinding tool D may be provided with, as shown in FIG. 16, a hole 114 which guides the gas supplied from the nozzle 121 to a contact surface between the grinding tool D and the processing mechanism 43. The hole 114 guides the gas supplied from the nozzle 121 into a gap between the bottom surface of the flange 43*a*1 and the top surface of the grinding tool D, for example. The hole 114 may be a dedicated hole, or the hole (for example, the straight hole or the screw hole) for mounting the fastener E may be used as the hole 114.

Figure 17:
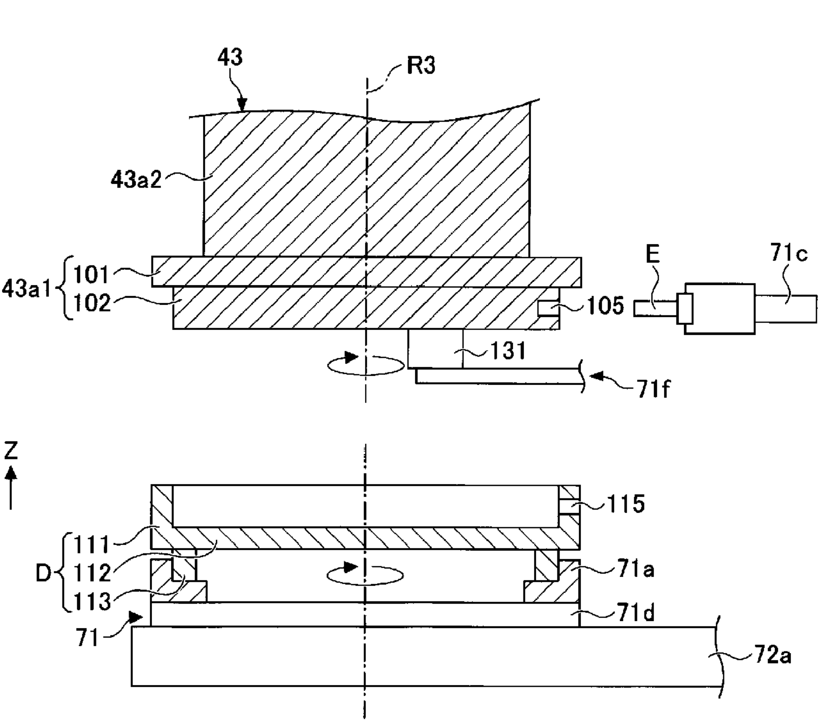
FIG. 17 is a cross sectional view illustrating an example of a second rotating mechanism.

As shown in FIG. 17, the replacing mechanism 71 may include a second rotating mechanism 71*f* configured to rotate the spindle shaft 43*a*2 of the processing mechanism 43. The second rotating mechanism 71*f* includes, for example, a roller 131. A rotation center line of the roller 131 is parallel to the rotation center line R3 of the spindle shaft 43*a*2, and the roller 131 comes into contact with the flange 43*a*1. When the roller 131 is rotated, the flange 43*a*1 is also rotated by friction.

The second rotating mechanism 71*f* rotates the flange 43*a*1 before the grinding tool D is mounted to the flange 43*a*1, thus allowing a hole 105 of the flange 43*a*1, through which the fastener E is mounted, (for example, a screw hole or a straight hole) to be directed toward a required direction. At this time, the controller 76 may monitor the direction of the flange 43*a*1 by using the imaging device 75 shown in FIG. 6, determine whether the direction of the flange 43*a*1 is a required direction, and control the rotation stop position of the flange 43*a*1.

Moreover, as shown in FIG. 17, the first rotating mechanism 71*d* rotates the grinding tool D before the grinding tool D is mounted to the flange 43*a*1, thus allowing a hole 115 of the grinding tool D, through which the fastener E is mounted, (for example, a straight hole or a screw hole) to be directed to a required direction. At this time, the controller 76 may monitor the direction of the grinding tool D by using the imaging device 75 shown in FIG. 6, determine whether the direction of the grinding tool D is a required direction, and control a rotation stop position of the grinding tool D. Thereafter, the leading end of the multi-joint arm 72*a* is lifted upwards, bringing the grinding tool D into contact with the flange 43*a*1.

The direction of the hole 115 of the grinding tool D, through which the fastener E is mounted, coincides with the direction of the hole 105 of the flange 43*a*1, through which the fastener E is mounted. The direction of any one set of the holes 115 and 105 is directed toward the manipulating mechanism 71*c*. Thereafter, the leading end of the multi-joint arm 72*a* is lifted upwards, and the grinding tool D is brought into contact with the flange 43*a*1. Then, the manipulating mechanism 71*c* fastens the grinding tool D and the flange 43*a*1 with the fastener E. Thereafter, the controller 76 repeatedly performs the rotation of the holding mechanism 71*a* by the first rotating mechanism 71*d* and the tightening of the fastener E by the manipulating mechanism 71*c*. At this time, the controller 76 may monitor the positions of the holes 115 and 105 by using the imaging device 75 shown in FIG. 6 to determine whether the positions of the holes 115 and 105 are required positions, and control a rotation stop position of the holding mechanism 71*a*. If all the fasteners E are tightened, the fastening of the grinding tool D and the processing mechanism 43 is completed.

So far, the processing apparatus, the method of mounting the processing tool of the processing apparatus, the replacing apparatus, and the replacing method according to the exemplary embodiment of the present disclosure have been described. However, the present disclosure is not limited to the above-described exemplary embodiment. Various changes, modifications, substitutions, additions, deletions and combinations may be made within the scope of the claims, which are all incorporated within a technical scope of the present disclosure.

For example, although the processing apparatus of the present disclosure is the grinding apparatus in the above-described exemplary embodiment, it may be a machining device, a cutting device, or the like. Moreover, the grinding includes polishing. The processing apparatus is not particularly limited as long as it has the processing mechanism to which the processing tool is mounted so as to be replaceable. When the processing apparatus is a machining device, a machining tool such as an end mill is provided in the processing mechanism in a replaceable manner. Moreover, when the processing apparatus is a cutting device, a cutting tool such as a blade is mounted to the processing mechanism in a replaceable manner. The processing tool is not particularly limited as long as it comes into contact with a processing target object and processes it. If the processing tool is worn out due to the contact with the processing target object, it is replaced.

In addition, although the processing target object processed by the processing apparatus of the present exemplary embodiment is the substrate W in the above-described exemplary embodiment, the processing target object is not limited to the substrate W.

This application claims priority to Japanese Patent Application No. 2020-081378, field on May 1, 2020, which application is hereby incorporated by reference in their entirety.

According to the exemplary embodiment, it is possible to suppress the operator from getting dirty when replacing the processing tool and, also, suppress the particles such as the processing debris from flowing to the outside.

We claim:

1. An installing method of a processing tool of a processing apparatus equipped with a holder configured to hold a processing target object, a processing mechanism to which the processing tool configured to process the processing target object held by the holder is installed in a replaceable manner, and an exterior cover accommodating therein the holder and the processing mechanism, the installing method comprising:

instructing, by the processing apparatus, a replacing apparatus to install the processing tool;

detecting, by the processing apparatus, an arrival of the replacing apparatus at a set position outside the exterior cover; and opening a shutter, which is configured to open or close an entrance opening of the exterior cover, to allow the replacing apparatus to advance to an inside of the exterior cover from an outside thereof through the entrance opening of the exterior cover, wherein the processing mechanism comprises a flange to which the processing tool is mounted, a spindle shaft including the flange at a lower end thereof, and a spindle motor configured to rotate the spindle shaft, wherein the replacing apparatus comprises:

a replacing mechanism configured to install the processing tool to the processing mechanism, or separate the processing tool from the processing mechanism; and a multi-joint arm configured to move the replacing mechanism;

wherein the replacing mechanism comprises:

a support member configured to hold the processing tool from below;

a first rotator member configured to rotate the processing tool and the flange simultaneously by rotating the support member; and a manipulating mechanism configured to tighten or loosen a fastener that fastens the processing tool to the flange of the processing mechanism, and wherein, in a state that a rotation of the support member is stopped by the first rotary rotator member, the manipulating mechanism is configured to tighten the fastener to fasten the processing tool.

2. The installing method of claim 1, wherein the instructing, by the processing apparatus, of the replacing apparatus to install the processing tool comprises:

determining, by the processing apparatus, whether a replacement of the processing tool is necessary and creating a replacement instruction for the processing tool; and transmitting, by the processing apparatus, the replacement instruction to the replacing apparatus.

3. The installing method of claim 1, further comprising: performing an auto setup after the processing tool has been completely replaced and after the replacing apparatus has been retreated from the entrance opening of the exterior cover.

* * * * *